(12) United States Patent
Lee et al.

(10) Patent No.: US 6,608,333 B1
(45) Date of Patent: Aug. 19, 2003

(54) ORGANIC LIGHT EMITTING DIODE DEVICE

(75) Inventors: Yung-Chih Lee, Taipei (TW); Chi-Chih Liao, Taipei (TW); Jiun-Haw Lee, Taipei (TW); Mei-Ying Chang, Hsinchu (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/248,113

(22) Filed: Dec. 19, 2002

(51) Int. Cl.⁷ .............................................. H01L 29/227
(52) U.S. Cl. .................. 257/98; 313/492; 313/503; 313/506; 313/507
(58) Field of Search ..................... 257/98; 313/492, 313/503, 506, 507

(56) References Cited

U.S. PATENT DOCUMENTS 6,262,441 B1 * 7/2001 Bohler et al. ................ 257/103
6,545,409 B2 * 4/2003 Kahen ......................... 313/504

\* cited by examiner

*Primary Examiner*—Nathan J. Flynn
*Assistant Examiner*—Pershelle Greene
(74) *Attorney, Agent, or Firm*—Jiang Chyun IP Office

(57) ABSTRACT

An organic light emitting diode (OLED) device. The OLED device comprises a transparent substrate, a plurality of anodes, an organic functional layer, a black layer and a plurality of cathodes. The anodes are positioned over a transparent substrate. The organic function layer is positioned over the transparent substrate covering the anodes. The black layer is positioned over the organic functional layer and the cathodes are positioned over the black layer. Through the black layer, the amount of back reflection of external light is reduced and the contrast of the display device is increased.

11 Claims, 6 Drawing Sheets

ORGANIC LIGHT EMITTING DIODE DEVICE

BACKGROUND OF INVENTION

1. Field of Invention

The present invention relates to an organic light emitting diode (OLED) device. More particularly, the present invention relates to an OLED device having a black layer therein.

2. Description of Related Art

Due to rapid growth in the communication industry, portable equipment is a major center of development. Flat displays have become the principal human-machine interface. In general, flat panel displays are divided according to the types of techniques into plasma display panel (PDP), liquid crystal display (LCD), electro-luminescent display, light emitting diode (LED), field emission display (FED) and electro-chromic display. However, organic light emitting diode (OLED) device has the greatest potential to become the dominant flat panel display in the next generation. This is because the OLED display has many advantages including self-illuminating, no viewing angle retention, low energy consumption, easy to fabricate, low production cost, low operating temperature, quick response and full coloration.

FIG. 1 is a cross-sectional view of a conventional organic light emitting diode device. A conventional OLED device mainly includes a transparent substrate 100, a plurality of transparent anode strips 102, an organic functional layer 104 and a plurality of metallic cathode strips 106. The transparent substrate 100 is typically a glass substrate. The transparent anode 102 is made from a transparent conductive material such as an indiumtin oxide. The organic functional layer 104 is a stack of organic films typically includes a hole injection layer, a hole transporting layer, an organic electro-luminescent layer, an electron transporting layer and an electron injection layer. The metallic cathode 106 is usually made from aluminum, calcium or magnesium-silver alloy.

In general, for any types of display device, the ratio between full brightness and full darkness is a major factor determining the quality of the display. This brightness ratio is often referred to as the contrast ratio (CR). A large contrast ratio indicates a bigger contrast between objects. The contrast ratio (CR) is defined by the following formula (1)

$$CR = \frac{L_{sub,on} + R_{amb}}{L_{sub,off} + R_{amb}} \quad (1)$$

where $L_{sub,on}$ is the brightness level when a pixel is on, $L_{sub,off}$ is the brightness level when the pixel is off and $R_{amb}$ is the brightness level when external light enters the display device and gets reflected. If the brightness level is 100 when the pixel is on, and the brightness level is 1 when the pixel is off, the brightness level of the light that enters the display device and then reflects back out can be computed through the contrast ratio formula (1).

FIG. 2 is a graph showing the relationship between the contrast ratio of a conventional organic light emitting diode device and external brightness level. As shown in FIG. 2, the contrast ratio will decrease as brightness level of light from an external source is increased. In other words, image contrast will deteriorate as more light enters the display device. Thus, designing a display device having a high contrast ratio for increasing image clarity is a now major area of inquiry.

The company Luxell has developed an organic light emitting diode device having an optical interference layer. The OLED device design mainly includes inserting a very thin semi-transparent metallic layer and a transparent material layer between an organic light emitting layer and a metallic cathode. The transparent material layer is typically a metallic oxide layer. Through the destructive optical interference effect of the aforementioned structure, reflection is reduced to below 1% of the incoming external light. Hence, contrast ratio of the display device is increased considerably.

However, the organic functional layer inside the OLED is formed by evaporation while the transparent material layer (a metallic oxide layer) is formed by a sputtering. Major drawbacks of the aforementioned methods includes:

1. The fabrication of the organic light emitting layer and the optical interference layer must be carried out in different stations.
2. The fabrication of those thin films in different stations often leads to a stress mismatch between the films resulting in a drop in yield and an increase in production cost.
3. Because sputtering is the bombardment of a target with an energetic beam of ions, the process of forming the optical interference layer may lead to some damages in the organic light emitting layer.
4. Cost of the sputtering equipment (station) necessary for forming the optical interference layer is usually very expensive, thereby jacking up the investment cost.

SUMMARY OF INVENTION

Accordingly, one object of the present invention is to provide an organic light emitting diode (OLED) device having a black layer that can greatly reduce the amount of back reflection of incoming external light and increase the contrast ratio under strong illumination. Ultimately, image clarity of the display device is enhanced.

A second object of this invention is to provide an organic light emitting diode (OLED) device having a black layer fabricated by evaporation. Hence, the fabrication of the black layer and the organic light emitting layer are compatible with each other leading to a simpler manufacturing step. Moreover, the fabrication of the black layer through evaporation spares the organic light emitting layer from any damages.

A third object of this invention is to provide an organic light emitting diode (OLED) device having a black layer fabricated using a common organic light emitting material. Hence, the process of forming the black layer requires no additional evaporation material or equipment.

To achieve these and other advantages and in accordance with the purpose of the invention, as embodied and broadly described herein, the invention provides an organic light emitting diode (OLED) device. The OLED device mainly comprises of a transparent substrate, a plurality of anodes, an organic functional layer, a black layer and a plurality of cathodes. The anodes are positioned over a transparent substrate. The organic functional layer is positioned over the transparent substrate covering the anodes. The black layer is positioned over the organic functional layer and the cathodes are positioned over the black layer. Through the black layer, the amount of back reflection of external light is reduced and the contrast of the display device is increased.

In this invention, the anodes and the cathodes have a strip-like structure, for example. Moreover, the anodes extend in a direction perpendicular to the cathodes. The black layer is a composite layer that includes an organic material layer and a semi-transparent layer. The organic material layer is made, for example, from an organic compound or an organometallic compound such as copper phthalocyanine (CuPc), which has electron transporting capability. The semi-transparent layer is, for example, a very thin metallic layer such as an aluminum layer.

Furthermore, the organic functional layer in this invention is a composite layer that includes, for example, an hole injection layer, a hole transporting layer, an organic electro-luminescent layer, an electron transporting layer and an electron injection layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
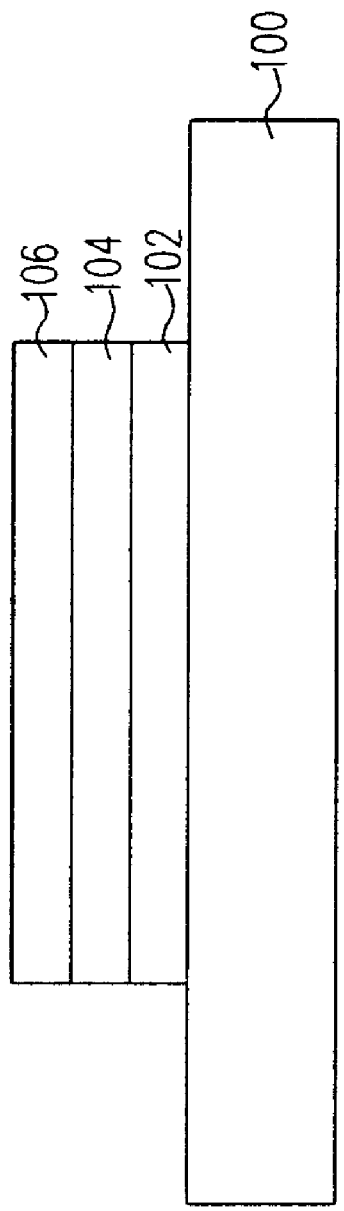
FIG. 1 is a cross-sectional view of a conventional organic light emitting diode device.
Figure 2:
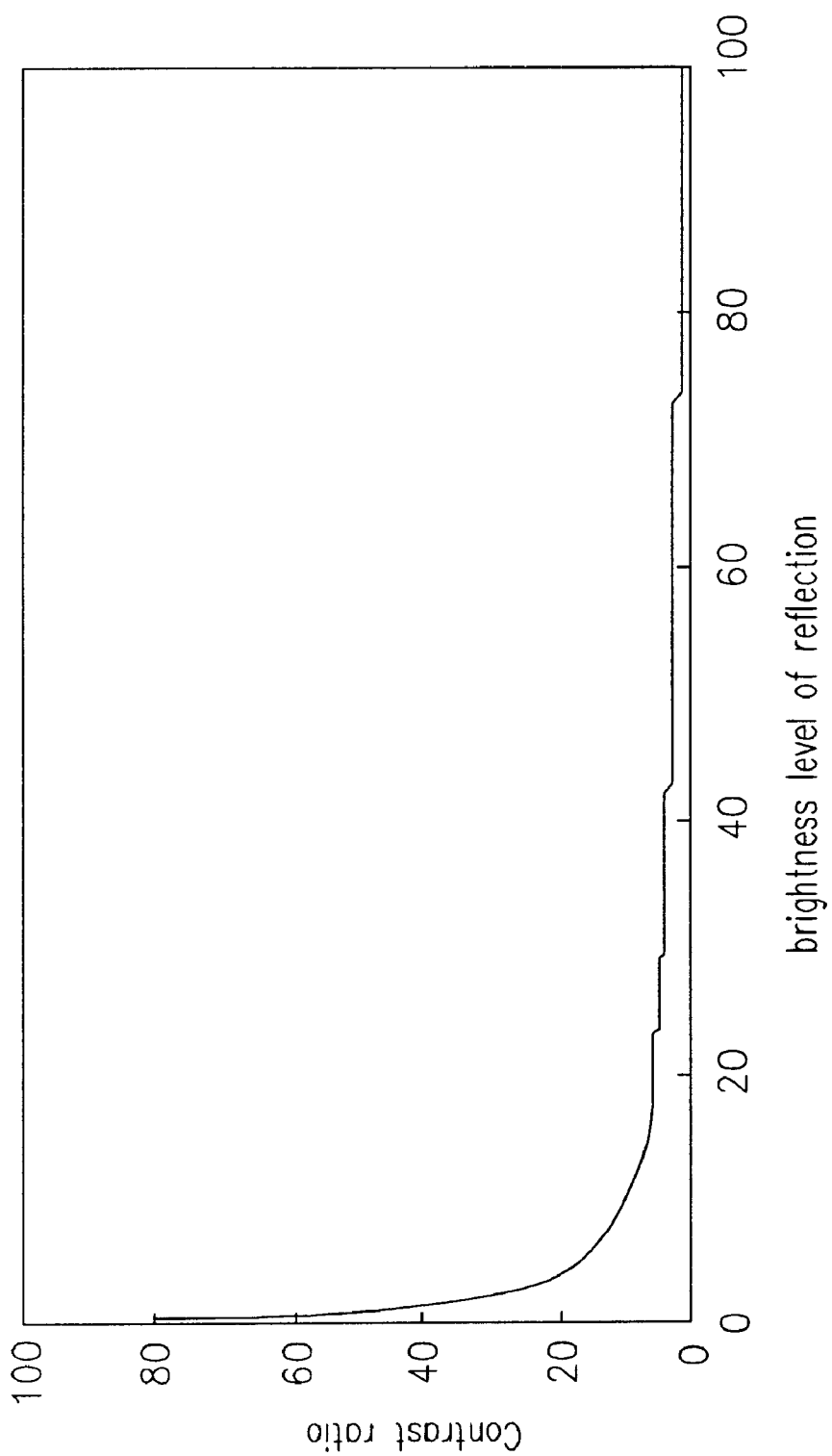
FIG. 2 is a graph showing the relationship between the contrast ratio of a conventional organic light emitting diode device and external brightness level.

Reference will now be made in detail to the present preferred embodiments of the invention, examples of which are illustrated in the accompanying drawings. Wherever possible, the same reference numbers are used in the drawings and the description to refer to the same or like parts.

Figure 3:
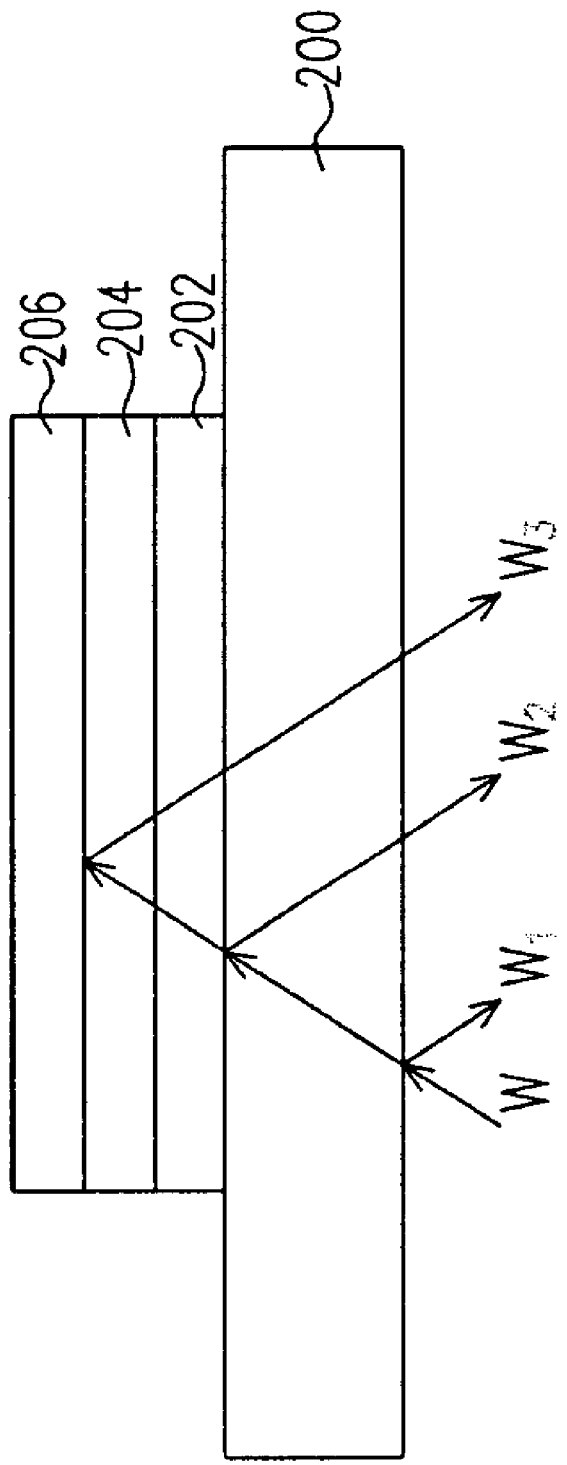
FIG. 3 is a diagram showing the back reflection of external light inside an organic light emitting diode device.

FIG. 3 is a diagram showing the back reflection of external light inside an organic light emitting diode device. As shown in FIG. 3, an organic light emitting diode device mainly comprises of a transparent substrate 200, a plurality of transparent anode strips 202, an organic functional layer 204 and a plurality of metallic cathode strips 206. The organic functional layer 204 has a refractive index $n_1$ very close to the refractive index $n_2$ of the transparent anode 202. The refractive index $n_1$ of the organic functional layer 204 is larger than the refractive index $n_3$ of the transparent substrate 200, for example. The value of $n_1$ is around 1.7, the value of $n_2$ is between 1.8 to 2.0 and the value of $n_3$ is about 1.5. In general, the refractive index $n_3$ is larger than the refractive index of air ($\approx 1$).

Light from the organic light emitting diode device is produced by the organic functional layer 204. Although the light is emitted randomly, the metallic cathode 206 can be regarded as a reflection layer. Hence, light is transmitted from the OLED device through the transparent substrate 200.

The outgoing light in the direction of the transparent substrate 200 is usually affected by external light so that contrast is poor. As an external beam of light entering the OLED device, a portion of the light will get reflected out in the transparent substrate 200 direction in the air/transparent substrate 200 interface, the transparent substrate 200/transparent anode 202 interface and the organic functional layer 204/metallic cathode 206 interface.

The portion of light reflected at the air/transparent substrate 200 interface $W_1$ is about 4% and the portion of light reflected at the transparent substrate 200/transparent anode 202 interface W is about 0.8%. However, the portion of light reflected at the organic functional layer 204/metallic cathode 206 interface $W_3$ exceeds 90%. Therefore, according to the figures, a large portion of the reflected light from the OLED device is produced by reflection at the organic functional layer 204/metallic cathode 206 interface. In other words, the interface between the organic functional layer 204 and the metallic cathode 206 is a major source of back reflection.

Figure 4:
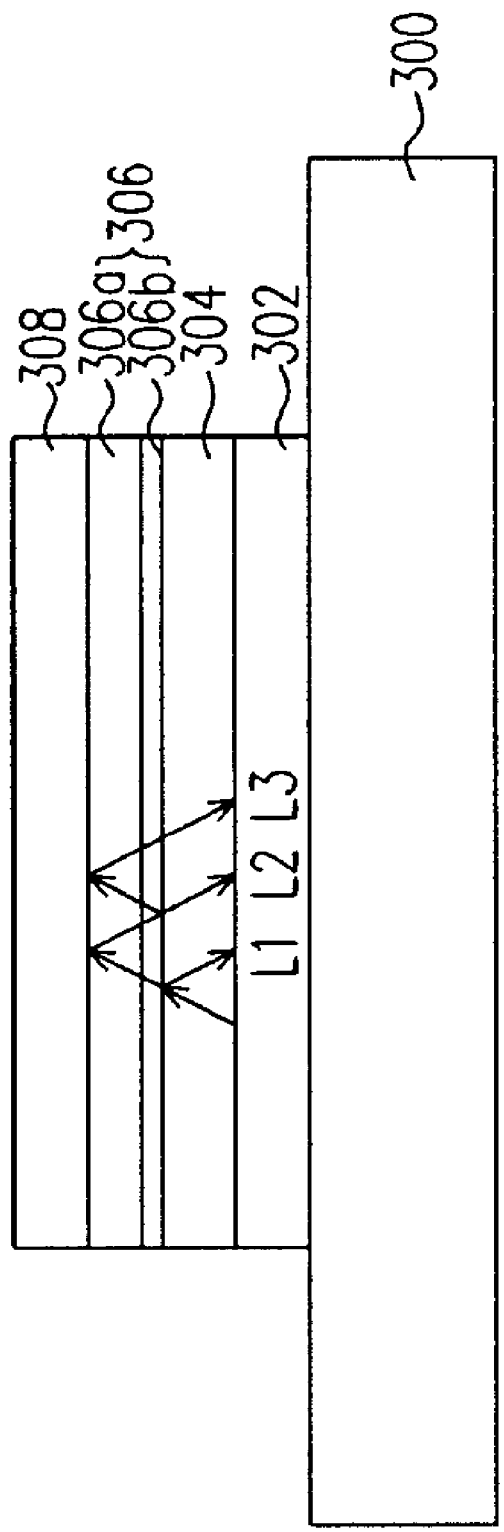
FIG. 4 is a schematic cross-sectional diagram of an organic light emitting diode device according to one preferred embodiment of this invention.

FIG. 4 is a schematic cross-sectional diagram of an organic light emitting diode device according to one preferred embodiment of this invention. As shown in FIG. 4, the organic light emitting diode device according to this invention mainly includes a transparent substrate 300, a plurality of transparent anode strips 302, an organic functional layer 304, a black layer 306 and a plurality of metallic cathode strips 308. Typically, the transparent substrate 300 is a glass panel. The transparent anodes 302 are normally fabricated using a transparent conductive material such as indiumtin oxide. The organic functional layer 304 is a stack of organic thin films typically includes a hole injection layer, a hole transporting layer, an organic electro-luminescent layer, an electron transporting layer and an electron injection layer. The metallic cathodes 308 are usually fabricated using a metallic material such as aluminum, calcium or magnesium-silver alloy.

The black layer 306 is a composite layer comprising of an organic material layer 306a and a semi-transparent layer 306b. The organic material layer 306a is an organic compound layer having an electron transporting capability or an organometallic compound layer, for example. The semi-transparent layer 306b is a very thin metallic layer, for example. In addition, the organic material layer 306a is fabricated using a material such as copper phthalocyanine (CuPc) and the semi-transparent layer 306b is fabricated using a material such as aluminum. The organic material layer 306a and the semi-transparent layer 306b together constitute the black layer 306 capable of reproducing an optical interference effect. Through a destruction optical interference effect, reflection rate of external light will drop considerably and hence increase the contrast ratio of the display device.

In other words, when a beam of external light impinges upon the interface between the semi-transparent layer 306b and the organic functional layer 304, a portion of the light $L_1$ is reflected while the remaining portion is permitted to transmit through. The beam of light transmitted through the semi-transparent layer 306b will be reflected back by the cathode 308. Similarly, a portion of the light $L_2$ reflected back from the cathode 308 will transmit through the semi-transparent layer 306b while the remaining portion will reflect towards the cathode 308. In general, a number of reflections may take place between the semi-transparent layer 306b and the metallic cathode 308 such as $L_3$. In this embodiment, by adjusting thickness of the organic material layer 306a, path difference between the rays $L_1$, $L_2$, $L_3$ and so on can be set to produce destructive interference so that strength of the reflected light beam is minimized as much as possible. Consequently, contrast ratio of the OLED device is increased.

Figure 5:
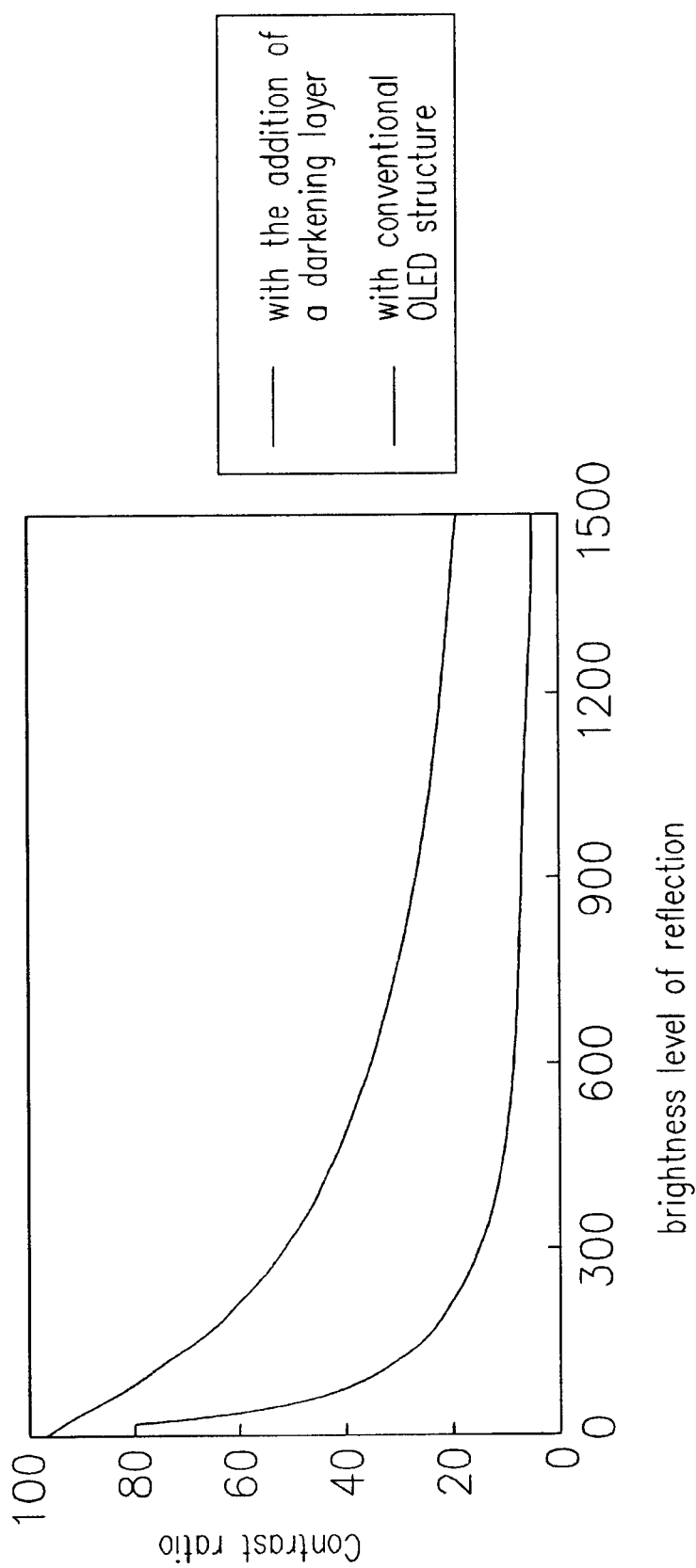
FIG. 5 is a graph showing the relationship between the contrast ratio of an organic light emitting diode device according to this invention and external brightness level.

FIG. 5 is a graph showing the relationship between the contrast ratio of an organic light emitting diode device according to this invention and external brightness level. As shown in FIG. 5, the black layer inside the OLED device has a superior contrast ratio compared with an OLED device having a conventional structure.

Figure 6:
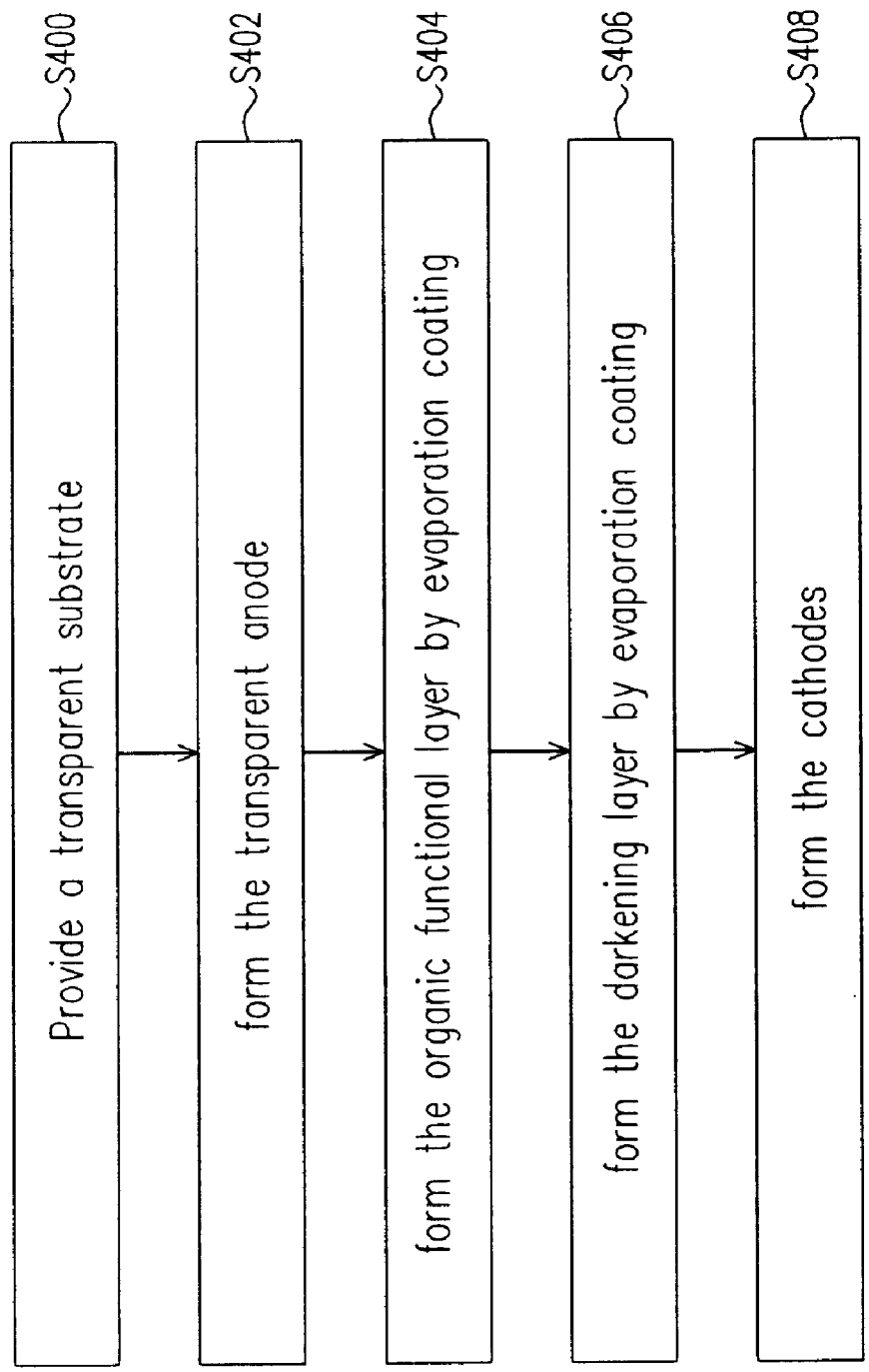
FIG. 6 is a flow chart showing the steps for fabricating an organic light emitting diode device according to one preferred embodiment of this invention.

FIG. 6 is a flow chart showing the steps for fabricating an organic light emitting diode device according to one preferred embodiment of this invention. As shown in FIG. 6, the fabrication of an organic light emitting diode device includes steps S400 to S408. In step S400, a transparent substrate is provided. In step S402, transparent anodes are formed. In step S404, a evaporation process is carried out to form the organic functional layer. In step S406, an evaporation process is conducted to form the black layer. Finally, in step S408, the cathodes are formed.

In this invention, the same evaporation equipment for forming the organic functional layer in step S404 is used to form the black layer in step S406. Both the organic material layer 306a and the semi-transparent layer 306b in the black layer 306 are fabricated using an organic material commonly used in producing an OLED device. Hence, there is no need to introduce additional evaporation materials or equipment.

In summary, major advantages of the OLED device in this invention includes:

1. This invention greatly reduces the amount of back reflection of external light by the OLED device. In this way, contrast ratio of the OLED device when subjected to a strong source of light is improved. Thus, clarity of image in the display device is boosted.
2. The black layer inside the OLED device is fabricated by evaporation, the same process as the fabrication of the organic light-emitting layer. Hence, the processing steps are simpler.
3. Since the black layer inside the OLED device is fabricated by conducting evaporation, damage to the organic light-emitting layer is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light emitting diode (OLED) device, comprising:

a transparent substrate;

a plurality of anodes over the transparent substrate;

an organic functional layer over the transparent substrate covering the anodes;

a black layer over the organic functional layer, wherein the black layer is further composed of an organic material layer and a semi-transparent layer; and a plurality of cathodes over the black layer.

2. The OLED device of claim 1, wherein the anodes and the cathodes have a longitudinal strip structure.

3. The OLED device of claim 2, wherein the anodes extend in a direction perpendicular to the cathodes.

4. The OLED device of claim 1, wherein material constituting the organic material layer includes copper phthalocyanine (CuPc).

5. The OLED device of claim 1, wherein material constituting the semi-transparent layer includes a metallic material.

6. The OLED device of claim 5, wherein material constituting the semi-transparent layer includes aluminum.

7. The OLED device of claim 1, wherein the organic functional layer may further comprise:

a hole injection layer over the anodes;

a hole transporting layer over the hole injection layer;

an organic electro-luminescent layer over the hole transporting layer;

an electron transporting layer over the organic electro-luminescent layer; and an electron injection layer over the electron transporting layer.

8. A black layer for inserting between an organic functional layer and a plurality of cathodes in an organic light emitting diode (OLED) device, the black layer comprising:

a semi-transparent layer over the organic functional layer; and an organic material layer between the semi-transparent layer and the cathodes.

9. The black layer of claim 8, wherein material constituting the organic material layer includes copper phthalocyanine (CuPc).

10. The black layer of claim 8, wherein material constituting the semi-transparent layer includes a metallic material.

11. The black layer of claim 10, wherein material constituting the semi-transparent layer includes aluminum.

* * * * *